(12) United States Patent
Knoops et al.

(10) Patent No.: US 12,077,864 B2
(45) Date of Patent: *Sep. 3, 2024

(54) PLASMA ATOMIC LAYER DEPOSITION

(71) Applicant: ASM IP HOLDING B.V., Almere (NL)

(72) Inventors: Harm C. M. Knoops, Eindhoven (NL); Koen de Peuter, Eindhoven (NL); Wilhelmus M. M. Kessels, Tilburg (NL)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/039,632

(22) Filed: Sep. 30, 2020

(65) Prior Publication Data
US 2021/0025059 A1 Jan. 28, 2021

Related U.S. Application Data
(63) Continuation of application No. 16/675,904, filed on Nov. 6, 2019, now Pat. No. 10,822,700, which is a (Continued)

(51) Int. Cl.
*C23C 16/52* (2006.01)
*C23C 16/34* (2006.01)
(Continued)

(52) U.S. Cl.
CPC ............ *C23C 16/52* (2013.01); *C23C 16/345* (2013.01); *C23C 16/45542* (2013.01);
(Continued)

(58) Field of Classification Search
CPC . C23C 16/52; C23C 16/345; C23C 16/45542; H01L 21/02219; H01L 21/0217; H01L 21/02274; H01L 21/0228
See application file for complete search history.

(56) References Cited

U.S. PATENT DOCUMENTS 5,595,638 A * 1/1997 Konuma ........... H01L 21/76888
205/108
9,637,823 B2 5/2017 Knoops et al.
(Continued)

OTHER PUBLICATIONS

Knoops, et al. "Reaction Mechanisms of Atomic Layer Deposition of $TaN_x$ from $Ta(NMe_2)_5$ Precursor and $H_2$-based Plasmas," J. Vac. Sci. Technol. A, vol. 30, No. 1, 01A101-1-01A101-10, 2012.
(Continued)

*Primary Examiner* — Monica D Harrison
*Assistant Examiner* — Andre C Stevenson
(74) *Attorney, Agent, or Firm* — Banner & Witcoff, Ltd.

(57) ABSTRACT

Plasma atomic layer deposition (ALD) is optimized through modulation of the gas residence time during an excited species phase, wherein activated reactant is supplied such as from a plasma. Reduced residence time increases the quality of the deposited layer, such as reducing wet etch rates, increasing index of refraction and/or reducing impurities in the layer. For example, dielectric layers, particularly silicon nitride films, formed from such optimized plasma ALD processes have low levels of impurities remaining from the silicon precursor.

17 Claims, 8 Drawing Sheets

Related U.S. Application Data continuation of application No. 16/116,321, filed on Aug. 29, 2018, now Pat. No. 10,480,078, which is a continuation of application No. 15/499,188, filed on Apr. 27, 2017, now Pat. No. 10,072,337, which is a continuation of application No. 14/231,317, filed on Mar. 31, 2014, now Pat. No. 9,637,823.

(51) Int. Cl.
*C23C 16/455* (2006.01)
*H01L 21/02* (2006.01)

(52) U.S. Cl.
CPC .... *H01L 21/0217* (2013.01); *H01L 21/02219* (2013.01); *H01L 21/02274* (2013.01); *H01L 21/0228* (2013.01)

(56) References Cited

U.S. PATENT DOCUMENTS

| | | | |
|---|---|---|---|
| 10,072,337 | B2 | 9/2018 | Knoops et al. |
| 10,480,078 | B2 | 11/2019 | Knoops et al. |
| 10,822,700 | B2* | 11/2020 | Knoops .............. H01L 21/0228 |
| 2005/0009325 | A1 | 1/2005 | Chung et al. |
| 2005/0042865 | A1 | 2/2005 | Cabral et al. |
| 2005/0202656 | A1* | 9/2005 | Ito .................. H01L 21/823814 |
| | | | 438/587 |
| 2006/0272677 | A1* | 12/2006 | Lee .................. H01L 21/02052 |
| | | | 134/28 |
| 2008/0241388 | A1* | 10/2008 | Clark .................. H01L 29/7843 |
| | | | 427/255.394 |
| 2009/0155606 | A1* | 6/2009 | Yoon ..................... C23C 16/345 |
| | | | 428/446 |
| 2012/0045589 | A1* | 2/2012 | Ivanov .............. C23C 16/45553 |
| | | | 427/248.1 |
| 2014/0179107 | A1* | 6/2014 | Nowling ........... H01L 21/31111 |
| | | | 438/694 |
| 2015/0004805 | A1 | 1/2015 | Omstead et al. |
| 2015/0017812 | A1* | 1/2015 | Chandrasekharan ...................... C23C 16/45561 |
| | | | 438/762 |
| 2015/0021599 | A1* | 1/2015 | Ridgeway ............. C23C 16/345 |
| | | | 257/43 |
| 2015/0031218 | A1 | 1/2015 | Karakawa |

OTHER PUBLICATIONS

Knoops, et al. "Plasma-assisted ALD of Silicon Nitride from BTBAS, 13th International Conference on Atomic Layer Deposition," Jul. 28-31, 2013, San Diego, California, U.S.A., 21 pages.

* cited by examiner

PLASMA ATOMIC LAYER DEPOSITION

REFERENCE TO RELATED APPLICATION

The present application is a continuation of U.S. application Ser. No. 16/675,904, filed Nov. 6, 2019, which is a continuation of U.S. application Ser. No. 16/116,321, filed Aug. 29, 2018, now U.S. Pat. No. 10,480,078, which is a continuation of U.S. application Ser. No. 15/499,188, filed Apr. 27, 2017, now U.S. Pat. No. 10,072,337, which is a continuation of U.S. application Ser. No. 14/231,317 filed Mar. 31, 2014, now U.S. Pat. No. 9,637,823, which are hereby incorporated by reference in their entirety.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

PARTIES OF JOINT RESEARCH AGREEMENT

The present invention is the result of a joint research agreement between ASM International, N.V. and Technische Universiteit Endhoven (Eindhoven University of Technology).

FIELD

The present invention relates generally to atomic layer deposition (ALD), and more particularly to identification and use of optimal conditions during plasma phases.

BACKGROUND

In recent years atomic layer deposition (ALD) has been adopted as a manufacturing technique in several fields, including the semiconductor industry. ALD deposits films in a cyclical process, typically alternating exposure of the substrate to two or more reactants in phases separated in time and/or space, where each phase has a self-limiting effect. For example, one phase of the cycle can chemically adsorb, in a self-limiting fashion, a monolayer or less of a precursor or fragment thereof in each cycle. Often the adsorption is self-limited due to ligands of the precursor being inert relative to the adsorbed species, such that after the substrate surface is saturated the adsorption process stops. Reactants in a subsequent phase can react with the adsorbed species to remove the condition that limits the adsorption, such as stripping away ligands form the adsorbed species, for example by chemical reduction or replacement reactions, such that the precursor can again adsorb in a self-limiting fashion in a subsequent cycle. In one example, less than a monolayer of an organic silicon precursor can adsorb in a first phase, and an oxygen-containing reactant can strip the organic ligands from the adsorbed species and leave oxygen in a second phase.

More complicated ALD recipes may include three, four or more reactants, and relative frequencies of the phases may be adjusted to tune the composition of the layer being formed. Typically, each cycle leaves about a molecular monolayer or less per cycle. Many ALD processes average one monolayer every 3-10 cycles because of variety of reasons, such as steric hindrance from large precursor molecules prevents access to all reaction sites in a single cycle, lack or low number of reactive sites or other reasons. Mutually reactive reactants can be kept separated in time and/or space, e.g., by separating pulses by purging, or moving the substrate through different zones with separate reactants. However, variations on the process, such as schemes providing hybrid ALD and chemical vapor deposition (CVD) reactions, can obtain more than a monolayer per cycle.

Despite rather slow growth rates compared to traditional deposition techniques, such as sputter deposition and CVD, ALD has been growing in popularity for several reasons. For example, in the semiconductor industry, ALD can provide much greater step coverage, or conformal growth, or smoother or more uniform films over complex topography compared to other deposition techniques, particularly for very thin layers over structures with high aspect ratios. Need for such conformal layers tends to increase as circuits become more dense. Because the technique is self-limiting in each cycle, and because usually the growth rate tends to be independent of small temperature variations over a substrate, ALD offers almost perfect step coverage. Moreover, ALD tends to involve lower temperatures than other deposition techniques, which also becomes more important with successive generations of integrated circuits in order to conserve ever-stricter thermal budgets and preserve precise device junction depths. Similarly, ALD is increasingly attractive to other industries that could benefit from ultra-thin, conformal and/or low temperature depositions.

To preserve self-limiting nature of ALD it can be important to prevent thermal breakdown of precursors that are meant to adsorb largely intact. Thermal breakdown can lead to time-dependent CVD growth mechanisms which can nullify the conformal deposition advantages of ALD. At the same time, some precursors demand significant energy to react with adsorbed species. Ensuring these competing conditions are satisfied can involve delicate trade-offs between substrate temperatures and prolonged exposures to ensure saturative surface reactions.

Plasma ALD processes, sometimes referred to as plasma assisted ALD or plasma enhanced ALD (PEALD), have been developed in order to improve the reaction energy of some phases without increasing the temperature of the substrate. For example, an organic or halide reactant can adsorb less than a monolayer in a first phase, and a second phase can expose the substrate to the products of a nitrogen-, hydrogen- or oxygen-containing plasma to strip ligands from the adsorbed species and/or leave nitrogen or oxygen in the film. However, in some cases it has been difficult to obtain high quality films using conventional plasma ALD techniques.

SUMMARY

In one aspect, a method is provided for depositing a layer of silicon nitride by plasma atomic layer deposition. The method includes providing a substrate in a reaction space. In a first phase, the substrate is contacted with a silicon precursor to adsorb an adsorbed species of the silicon precursor on the substrate. In a second phase, the substrate is contacted with excited nitrogen species to react with the adsorbed species. The excited nitrogen species is supplied to or formed in the reaction space for greater than about 0.1 s, and a residence time of the gas species during second phase in the reaction space is less than about 1.0 s.

In another aspect, a method is provided for tuning a plasma atomic layer deposition (ALD) process. The method includes conducting a plasma ALD process to deposit a layer. The plasma ALD process has an adsorption phase and a plasma phase. A quality of the layer is measured. A residence time for the plasma phase is modulated to form a modified version of the plasma ALD process. The modified version of the ALD process is conducted to deposit a further layer, and the quality of the further layer is measured.

In another aspect, a method of optimizing a plasma ALD process is provided. The method includes optimizing impurity levels in films deposited by the plasma ALD process by modulating residence time for excited species in a reaction space volume.

DETAILED DESCRIPTION OF THE PREFERRED EMBODIMENTS

As noted in the Background section above, despite the theoretical advantages that plasma ALD provide in lowering substrate temperatures, thereby preserving thermal budgets and opening the door to precursors that might decompose at higher temperatures, it has been difficult to obtain high quality films, particularly dielectric films such as silicon oxides, metal oxides and silicon nitrides.

Somewhat counterintuitively, the inventors have found that in plasma ALD of certain materials, limiting the gases' residence time in the reaction space for each plasma phase can improve the quality of the film, indicating a fuller reaction can be achieved with lower exposure time to the excited species. Herein reference is made to excited species' or plasma products' residence time for convenience. It will be understood, however, that the residence time applies to all vapor phase species supplied through the reaction space during the plasma phase, including any non-excited species. Conventionally, ALD designers have tended to prolong reactant exposure times to achieve saturation of surface reactions, or modulated other parameters, such as temperature, pressure or plasma power, in attempts to optimize deposition speed and quality. Moreover, a prolonged exposure to reactants would be expected to lead to more efficient saturation with the least amount of reactant. However, conventional attempts at optimization have not been satisfactory for many plasma ALD processes, particularly for dielectric oxides and nitrides. For example, depositing silicon nitride from alternation of organic precursors with nitrogen plasma products has been found to produce poor film density, wet etch rates and/or impurity levels. According to the teachings herein, reducing plasma reactant residence time can increase film quality, and modulating residence time against measured film quality can improve film quality (e.g., low impurity levels, high density).

Figure 1:
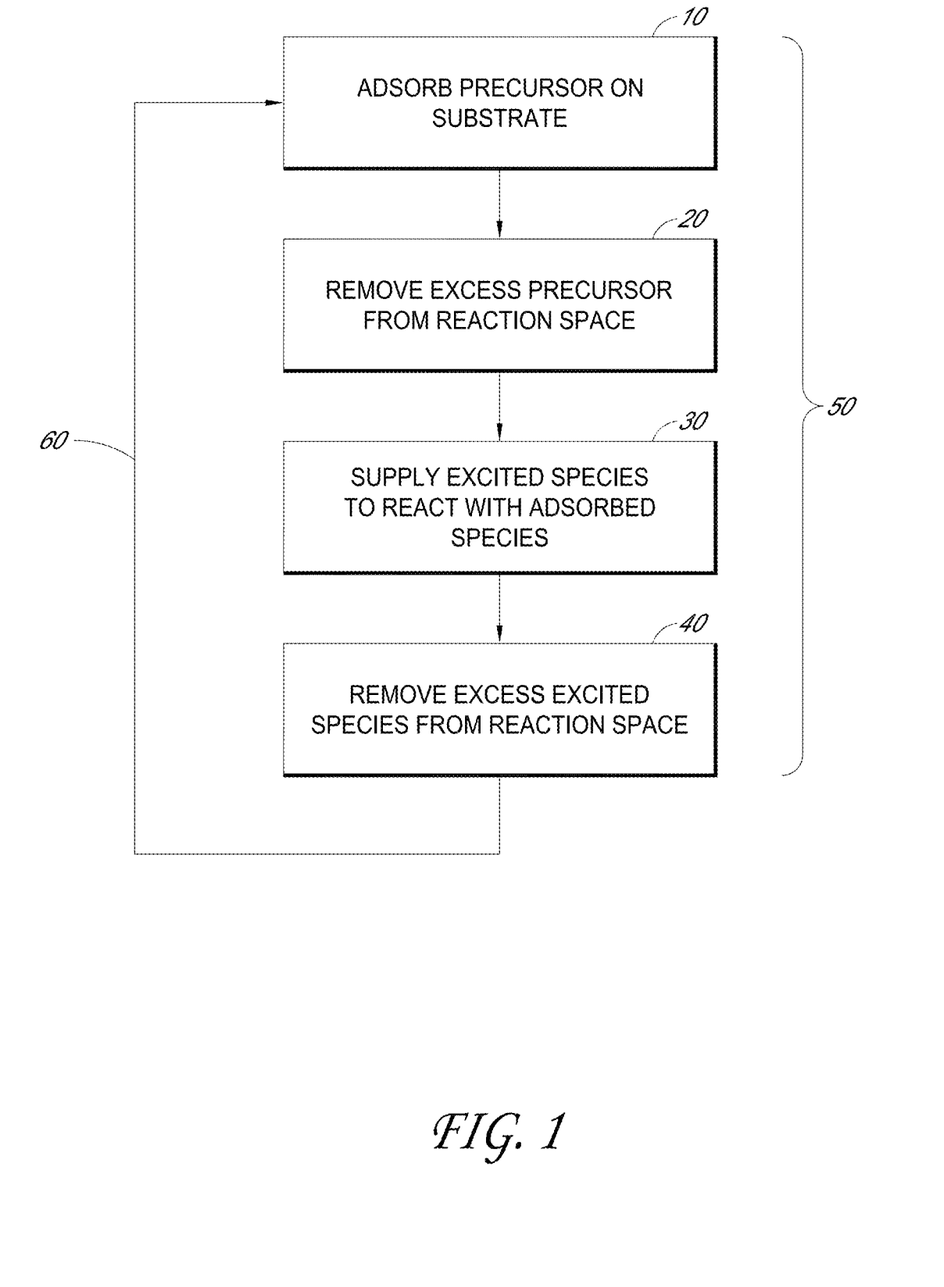
FIG. 1 is a flow chart illustrating a general process flow for simple plasma ALD sequences.

FIG. 1 is a simplified flow diagram of a generic plasma ALD process, to which techniques described herein can be applied. For purposes of illustration, a simple two-reactant cycle is illustrated. The skilled artisan will readily appreciate that each cycle can include additional, unillustrated pulses of different reactants (for example, a third reactant pulse, fourth reactant pulse, etc., can be introduced), or of the same reactants, and that not all cycles need to be identical (e.g., a third reactant can be introduced every five cycles to incorporate a desired percentage of different elements). The illustrated two-reactant cycle suffices to explain the embodiments, but the skilled artisan will appreciate that the principles and advantages of the embodiments taught herein can be readily extended to more complex ALD recipes. Furthermore, because it is cyclical, the plasma ALD process need not begin with an adsorption phase and can begin with an excited species phase. Prior to loading in to a plasma deposition reactor, the substrate may be pre-cleaned. Additionally or alternatively, the substrate may be cleaned or otherwise conditioned for deposition prior to the process illustrated in FIG. 1.

For convenience of description, the reactant that is adsorbed in the plasma ALD process is referred to herein as a precursor, while the excited species is referred to as a reactant. It will be understood that both the precursor and the excited species serve as ALD reactants, and also that the excited species can also serve as a precursor to the extent it leaves elements in the deposited film. In dielectric film deposition examples, excited nitrogen or excited oxygen species can perform exchange reactions with ligands from a prior adsorbed layer. Also for convenience, the substrate is considered to include previously deposited or adsorbed materials, such that references to contacting the substrate will be understood to include contacting previously deposited or adsorbed materials.

In the first illustrated block 10, the first reactant, or precursor, contacts a substrate to adsorb thereon. It will be understood that the adsorbed species may comprise a fragment of the precursor molecule, such that some ligands may be lost in the process, but that the precursor is not thermally decomposed. In the next block 20, any excess precursor is removed from the reaction space Typically supply of the precursor is stopped at this stage. Such removal can be accomplished, e.g., by purging the reaction chamber or space, pump down, moving the substrate away from a zone in which the precursor is supplied, or combinations thereof. It will be understood that removal of reactants from the reaction space can be a relative action and can be understood as movement of excess reactants in relation to the vicinity of the substrate; for example, in space-divided ALD moving the substrate from the zone effectively moves the reaction space associated with the substrate, leaving the reactants of the prior phase behind in a different reaction zone. In the next block 30, the substrate is contacted with excited species, which react with the adsorbed species on the substrate. The phase of plasma ALD in which excited species are supplied can be referred to as a "plasma phase," although plasma discharge is not always employed to create the excited species, and even when an actual plasma discharge is created, it may be remote from the substrate and plasma products are supplied to a downstream substrate. For simplicity, the term "excited species" used herein can be understood to encompass electrons, ions, radicals, atoms or other excited species that can, for example, be generated by a plasma. Typically the excited species are formed in a plasma discharge and depending on how they are supplied to the reaction space where substrate is loaded the excited species may comprise electrons, ions, radicals and/or atoms, for example oxygen, hydrogen or nitrogen plasma, ions, radicals, atomic oxygen/hydrogen/nitrogen, or other excited species that can, for example, be generated by a plasma. Thus some excited species such as O, H and N can be electrically neutral. In some embodiments the excited species does not comprise hydrogen. In some embodiments the excited species comprise only nitrogen. In some embodiments the excited species comprise only oxygen. Skilled artisan will understand that, for example, during plasma discharge additional gases may be present in addition to the excited species, such as rare gases like He, Ne, Ar to help in plasma ignition or otherwise make the process better like more stable and repeatable, but these species are considered not to be significant contributors to the film growth.

Excited species may be generated in situ in the reaction chamber, or may be supplied from a remote plasma unit (RPU) or the like. In various embodiments excited species may be generated by coupling power, such as by RF alternated electrical fields, microwave standing waves, ultraviolet light, or other forms of energy, to a flowing vapor phase reactant. The excited species reaction with the adsorbed species may strip ligands from adsorbed species to prepare the surface for subsequent reactants, and may additionally contribute elements to the film. In block 40, excess excited species are removed from the reaction space. Such removal can be accomplished, e.g., by turning off the power that generates the excited species, and by physical removal as in block 20, e.g., by purging, pump down, moving the substrate away from a zone in which the excited species is supplied, or combinations thereof. In some embodiments, the excited species is formed from gases that are inert under the deposition conditions in the absence of excitement, such as $N_2$ or $O_2$, depending upon the reactivity of the adsorbed species. Limiting residence time as disclosed below aids in more quickly eliminating active species in block 40 after the plasma power is removed.

The blocks 10-40 together define a cycle 50, which can be repeated until a film of the desired thickness is left on the substrate. As noted above, the cycle 50 can include additional reactant supply blocks (not shown), and need not be identically performed in each repetition. For example, other reactant(s) can be introduced in separate phase(s) in each cycle; other reactant(s) can be introduced in separate phase(s) every few cycles to incorporate a controlled amount of another element; other reactant(s) can be introduced in separate phase(s) in each cycle or every few cycles for gettering; separate reactants can be provided for stripping ligands from the adsorbed species and for contributing additional elements; etc.

The techniques taught herein can be applied to plasma enhanced or assisted ALD in a wide variety of reactor configurations. FIGS. 2A-2D, for example, illustrate a number of remote plasma ALD reactors. FIG. 3 illustrates a direct plasma ALD reactor. Similar parts are referred to by like reference numbers in the drawings.

Figure 2A:
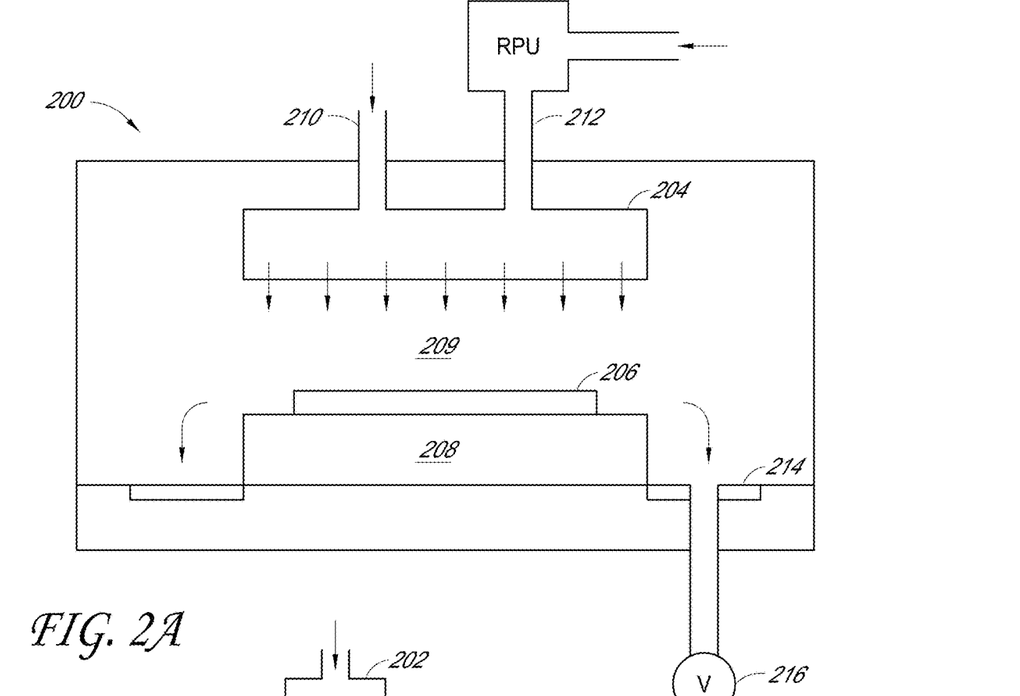
FIGS. 2A-2D are schematic representations of examples of remote plasma reactors that can be employed for plasma ALD processes described herein.
Figure 3:
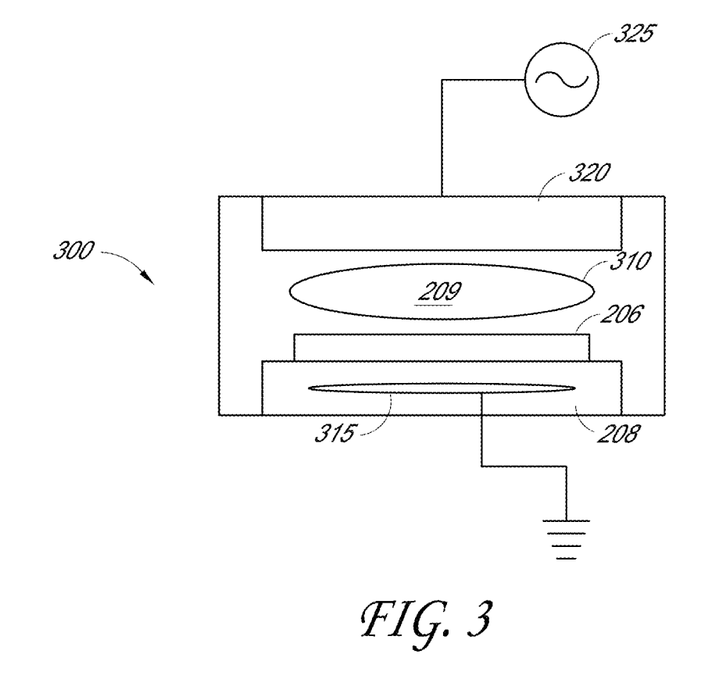
FIG. 3 is a schematic representation of a direct plasma reactor that can be employed for plasma ALD processes described herein.

FIG. 2A illustrates a showerhead ALD reaction chamber 200 with a remote plasma unit (RPU) 202. The reactor includes a showerhead 204 configured to receive and distribute reactant across a substrate 206 on a substrate support 208. A reaction space 209 is defined between the showerhead 204 and the substrate 206. A first inlet 210 communicates with a source of a first reactant, or precursor, and a second inlet 212 communicates with the RPU 202, which in turn communicates with a source of a second reactant to be activated or excited in the RPU 202. Additional inlets (not shown) can be provided for separate sources of inert gases and/or additional reactants, and the showerhead 204 can also be provided with a separate exhaust (not shown) to speed removal of reactants between phases. While the inlet 210 for a non-plasma reactant and the inlet 212 from the RPU are both shown communicating with the plenum of the showerhead 204, it will be understood that in other arrangements the inlets can independently feed reactants to the reaction space and need not share a showerhead plenum. An exhaust outlet 214, shown in the form of an exhaust ring surrounding the base of the substrate support 208, communicates with a vacuum pump 216.

Figure 2B:
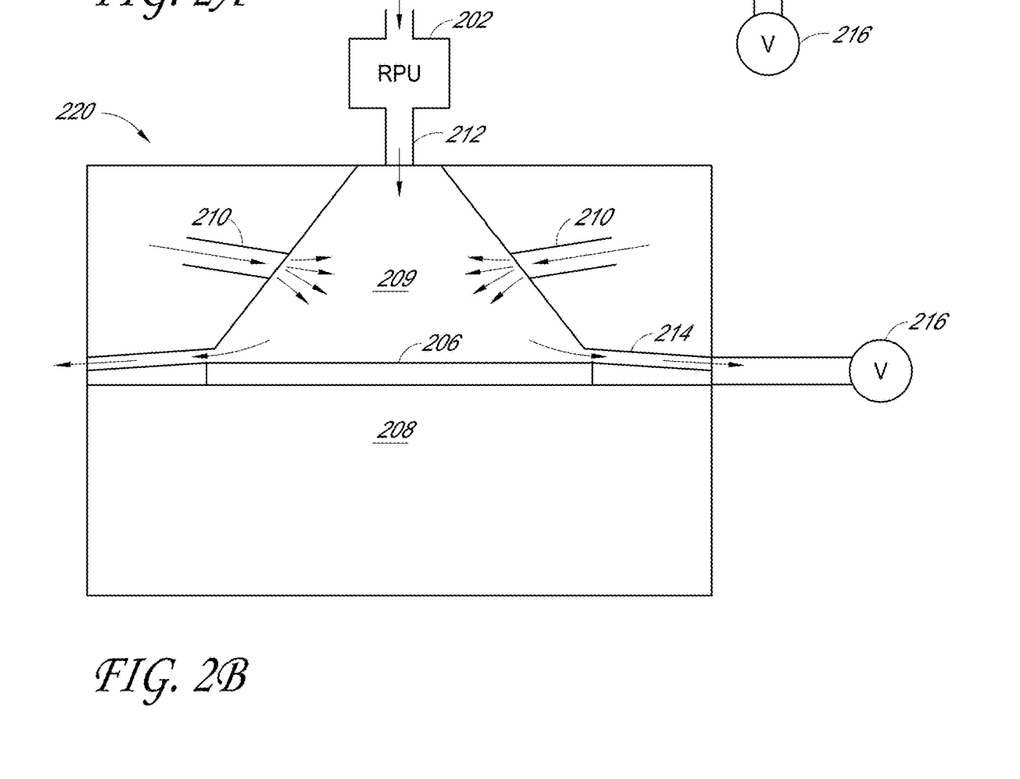

FIG. 2B illustrates a different configuration of a plasma ALD reaction chamber 220. The operation of reaction chamber 220 can be similar to that of the showerhead reaction chamber 210 of FIG. 2C, except that no showerhead plate is present. The arrangement lacks the uniform distribution of a showerhead plate. Such distribution can be dispensed with for the theoretically self-saturating surface reactions of ALD, although with less uniform distribution each phase may take longer to saturate the substrate 206. An advantage of the chamber 220 of FIG. 2B is that no restrictions are present between the inlet 212 for the remote plasma products from the RPU 202, such that more active species survive to reach the substrate 206 compared to use of an intervening showerhead plate. Such line-of-sight remote plasma arrangements can be advantageous for processes that benefit from more energetic active species during the plasma products phase of the plasma ALD process, or processes that employ activated species more susceptible to recombination. The illustrated chamber 220 includes a separate inlet 210 to the reaction space 209 for non-plasma reactants, also referred to herein as precursors, to minimize deposition reactions upstream of the reaction space 209.

Figure 2C:
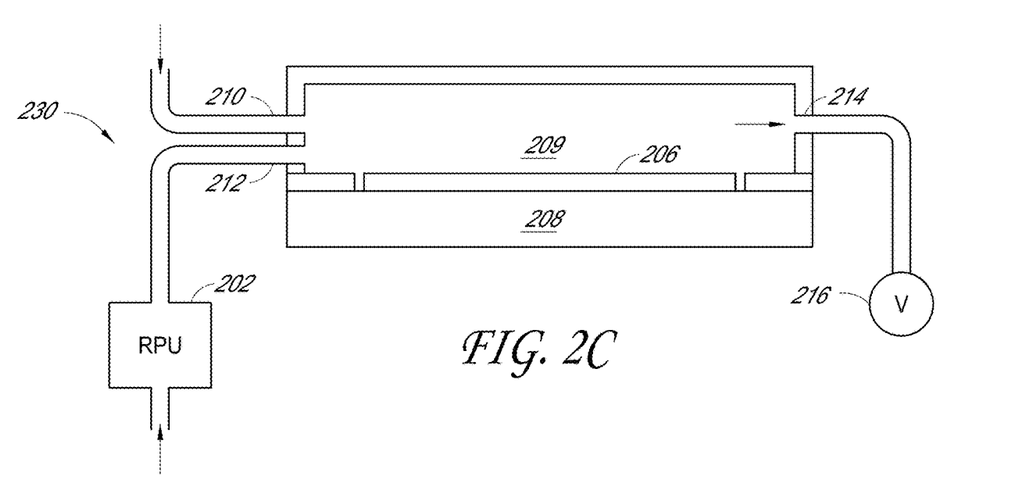

FIG. 2C illustrates a different configuration of a plasma ALD reaction chamber 230. Typically known as a horizontal flow reactor, the reaction chamber 230 is configured with a first reactant inlet 210 and a second reactant inlet 212, communicating with the RPU 202, at one side of the chamber 230, and an exhaust outlet 214 at an opposite side of the reaction chamber 230. As noted with respect to FIG. 2C, additional inlets (not shown) can be provided for separate sources of inert gases and/or additional reactants. Separate inlets 210 and 212 are shown to minimize deposition reactions upstream of the reaction space 209, as is generally preferred for ALD reactors, but it will be understood that in other arrangements the different reactants can be provided through a common inlet manifold. The skilled artisan will appreciate that in other types of horizontal flow reactors, the different reactants can also be provided from different sides of the chamber, with separate exhausts on opposite sides, such that a first reactant can flow in one direction and a second reactant can flow in another direction in separate phases.

Figure 2D:
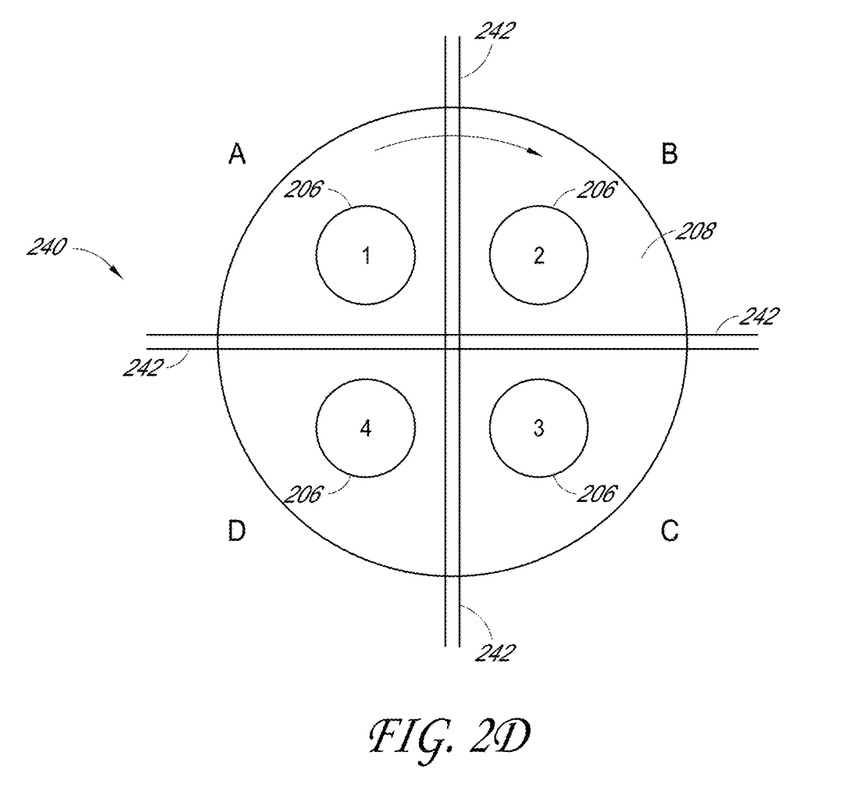

FIG. 2D illustrates another example of a remote plasma ALD reaction chamber 240. The illustrated chamber is configured for space-divided ALD reactions, rather than time-divided reactions. The space-divided reactions employ different zones, here zones A, B, C and D, through which substrates move. Alternatively, the gas injection system can move in relation to the substrates and substrates might be stationary or rotating. The zones are separated by barriers 242, which may be physical walls, inert gas curtains, exhausts, or combinations thereof that minimize vapor interactions among the zones A-D. The substrate support 208 can take the form of a rotating platform, as shown, or a conveyor belt (not shown) for linearly arrayed zones. In other example, zone A could be supplied consistently with a first reactant, such as a non-plasma precursor that adsorbs on the substrate, zones B and D could be supplied with inert or purge gas, and zone C could be supplied with a remote plasma activated second reactant. Substrates 206 (four shown) move through the zones to sequentially be exposed to the first reactant (zone A), inert gas (zone B), remote plasma activated second reactant (zone C), and inert gas (zone D) before the cycle is repeated. In the case of space-divided plasma ALD, the residence time of the reactants can depend on both the speed of the reactants through the zone as well as the rate of movement of the substrate support 208. In some cases the substrate is stationary or rotating and the gas supply system, such as gas injector(s), is rotated over the substrates. Rotation speed of the injector (s) or substrates can also affect the gas residence time. In variations on space-divided ALD, a combination of space-divided and time-divided ALD could supply different reactants at different times to the same zone, while substrates move through the zones. Each zone may supply separate reactants, and additional zones may be added by providing larger platforms divided by greater numbers of zones, or by providing longer conveyors through greater numbers of zones.

FIG. 3 illustrates a direct plasma ALD reaction chamber 300, in which a plasma 310 is formed directly over the substrate 206 within the reaction space 209. For example, potential difference across two electrodes 315, 320 is alternated at radio frequency (RF) to generate alternating fields in the reaction space, which in turn generates a plasma discharge from vapors supplied to the reaction chamber. In the illustrated example, a grounded electrode 315 is provided within the substrate support 208, while a powered electrode 320 is spaced above the substrate 208 and connected to an RF power source 325. In other arrangements, the powered electrode can be in the substrate support and/or the walls of the chamber. The skilled artisan will appreciate that power may be coupled to the reactant gases to generate excited species within the reaction space in other ways, such as by inductive coupling from coils outside the chamber. Reactants for a direct plasma reactor can be supplied in any suitable manner, including the inlet arrangements of the time-divided ALD reactors of FIGS. 2A-2C, or the space-divided ALD reactor of FIG. 2D. For example, the powered electrode may be a showerhead through which at least one of the reactants is supplied. Separate inlets may be provided for different reactants, or multiple reactants can be supplied through the same inlet(s). Because at least one of the reactants may be inert (relative to the other reactant(s)) until activated by the plasma in the reaction space 209, supplying multiple reactants sequentially through the same inlet will not necessarily cause deposition reactions to take place in the inlet.

In general plasma ALD reactors can be configured for single substrates or for multiple substrates. In some arrangements, multiple substrates are stacked vertically; however, in order to maximize effectiveness of the excited species, multiple substrate reactors preferably array the substrates adjacent to one another, similar to the enlarged platform arrangement of FIG. 2D, whether or not configured for space-divided ALD operation. The effective reaction space volume can range from about 0.3 liter to about 20 liters, preferably about 0.5 liter to about 15 liters, and more preferably about 1 liter to about 10 liters and most preferably between about 1.0 liters to about 5 liters The reactor can be configured to accommodate standard semiconductor substrates, such as 150 mm, 200 mm, 300 mm or 450 mm wafers.

Figure 4:
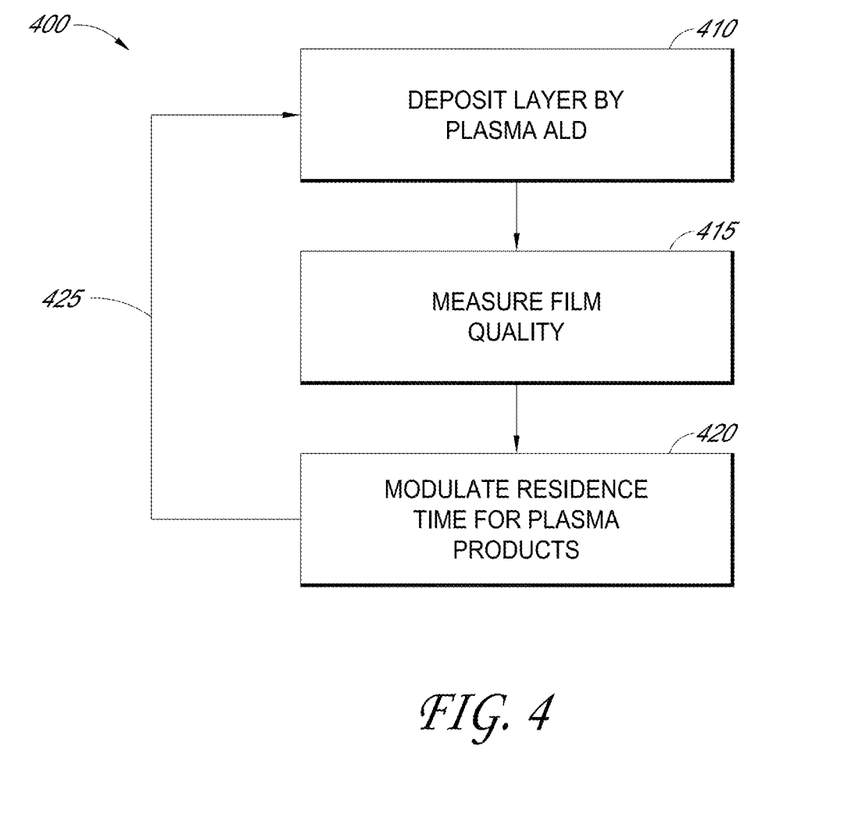
FIG. 4 is a flow chart illustrating techniques for optimizing film quality and/or growth rates for plasma ALD processes.

FIG. 4 illustrates a process 400 for optimizing a plasma ALD process. An established plasma ALD process, such as the simple two-reactant process illustrated in FIG. 1 or any of the more complex variations discussed with respect to FIG. 1, can be employed as a starting point for depositing a layer as shown in block 410. As aspect of the film or process quality is measured at block 415. Film quality can be measured, for example, using the level of impurities (e.g., oxygen or carbon for a silicon nitride deposition recipe), or an indicator of density or stoichiometry (e.g., etch rate for given etch conditions or index of refraction). The deposition recipe is then altered by modulation of residence time for the plasma phase, in which the substrate is exposed to excited species, at block 420, and the process repeated, as indicated by loop 425, with the new parameters. In this way the process recipe is adjusted to maximize film quality as measured, for example, by density, wet etch rates, index of refraction or impurity levels.

As noted above, the skilled artisan may expect an ALD process to be optimized by altering conditions to more efficiently achieve saturation of surface reactions. For example, if an unacceptably low growth rate per cycle or high impurity level is found, more efficient reactions may be expected from, e.g., prolonging a reactant exposure step or increasing substrate temperatures, as long as temperature remain in suitable regime (e.g., below the thermal decomposition temperature of reactants). Thus, conventional parameters modulated include temperature, pressure, reactant supply rates and reactant exposure durations. In plasma processing, plasma power may also be modulated.

It has been found that, for plasma phases of plasma ALD processes, modulation of reactant residence time in the process chamber can have a significant impact on film quality for plasma ALD. Without being limited by theory, it is possible that the more reactive species derived from plasma or otherwise excited can cause interactions within the reaction space that lead to redeposited species. For example, it is possible that ligands removed from the adsorbed species of a prior phase can interact with the energetic species still in the reaction space, can form new species, which can then interact with the substrate surface again and occupy reaction sites that would otherwise be available for the next ALD phase. Such redeposition can cause the process to take longer to remove ligands and byproduct from the substrate surface. Modulation of residence time, particularly reducing residence time by increasing the speed of the plasma products' movement through the reaction space, and limit the potential for redeposition and obtain more complete surface reactions, leaving fewer undesired impurities from unremoved or redeposited ligands and/or more dense films.

The residence time $\tau$ is defined as $$\tau = \frac{V}{S} \tag{Eq. 1}$$

where V is the volume of the reaction space and S is the effective volumetric pumping speed for the vacuum pump exhausting the reaction space. The residence time τ is an indication of how long the relevant species spend inside the reactor before being removed to the exhaust. It represents the 1/e time, or average time for reduction of the relevant species in the reaction space by 63.2%, rather than an absolute limit for every molecule of the relevant species.

The residence time can be varied by varying the effective pumping speed, where the volume of the reactor can be considered fixed. The effective pumping speed can be varied by changing the pump or its operating conditions. For example, the rotation speed of pumps can be varied, such as rotation speed of turbo pumps. The effective pumping speed also depends on the conductance of the pump line so that is also a hardware adjustment that can be used to change the effective pumping speed. Residence time can also be modulated by controlling valves between the reactor and pump, e.g. by partly closing an exhaust valve partly or by using a butterfly valve, and can be adjusted through the operating software of the reactor. The effective pumping speed can also depend upon the pressure inside the reactor so by changing the pressure, for example by changing the overall gas inlet flows, the effective pumping speed can also be varied. Moreover, different gases in the gas mixture can exhibit different effective pumping speeds where all other parameters are kept constant. The skilled artisan can determine how changing such additional variables can affect the effective pumping speed S for calculation of the residence time.

In some embodiments, residence time for the excited species in the plasma phase of the plasma ALD process can be optimized to minimize impurities in the deposited film, or to maximize film density. In some embodiments, impurity levels are kept below about 5 atomic %, preferably below about 2 atomic %, and more preferably below about 1%. In some examples, optimization can be performed using the principles taught herein to achieve impurity levels below about 0.5 atomic %. "Impurities" refer to elements present in the ALD reactants (both plasma and non-plasma reactants) that are not desired in the film, and the percentages provided above represent total impurity percentages in the deposited film, and therefore can also represent maximum impurity levels for each contaminant present in the precursors. For all materials hydrogen can be excluded from the definition of impurities as it is somewhat difficult to analyze accurately for very thin films. For example, for silicon oxide or metal oxides, impurities to be minimized include halides, carbon and nitrogen (to the extent these elements are present in the reactants). For silicon nitride or metal nitrides, impurities to be minimized include halides, carbon and oxygen (to the extent these elements are present in the reactants).\

In other arrangements, residence time for the excited species in the plasma phase of the plasma ALD process can be optimized to maximize an indicator of film density. The nitrogen plasma residence time for silicon nitride plasma ALD recipes in the examples below, for example, can be optimized to produce films with index of refractions greater than about 1.9, and preferably greater than about 1.95. Similarly, the nitrogen plasma residence time for silicon nitride plasma ALD can be optimized to produce films with low wet etch rates, for example, wet etch rates in a buffered, 7:1 dilute HF solution can be less than about 1.5 nm/min, preferably less than about 1.0 nm/min and more preferably less than about 0.7 nm/min.

At the same, in keeping with general advantages for ALD, plasma ALD processes with minimized residence time, as taught herein affords highly conformal layers over topography, relative to non-ALD deposition techniques. Conformality is typically measured in terms of step coverage over features on the substrate, and can either be measured as a ratio of deposited thickness on sidewalls to deposited thickness on top surfaces (S/T), or as a ratio of deposited thickness on bottom surfaces to deposited thickness on top surfaces (B/T). Under either measure, the processes taught herein can afford step coverage of more than about 75%, preferably more than about 90%, more preferably more than about 95% and in some cases more than about 99%. These ratios can hold true over substrates with features having height-to-width aspect ratios (AR) of about 2:1 or greater, preferably about 5:1 or greater, and even about 8:1 and greater.

In some embodiments, residence time for the excited species in the reaction space is less than about 1.0 s. Preferably the residence time is less than 0.5 s, more preferably less than about 0.2 s. In some embodiments, residence time may be below about 0.05 s and if carefully optimized residence times below about 0.01 s can be achieved. Depending on the reaction space volume, the effective pumping speed to accomplish such residence times can vary. For most single substrate reactors, or multi-substrate reactors with zones sizes for individual substrates (similar to FIG. 2D), pump speed can vary from about 25 $m^3/h$ to about 5000 $m^3/h$. Preferably the pump speed is between about 50 $m^3/h$ and about 2500 $m^3/h$, and more preferably between about 100 $m^3/h$ and about 2000 $m^3/h$. Similarly, pressure within the reaction space can vary depending upon the reactor design and gas mixtures, but typically pressures can be between about $10^{-3}$ mbar and about $10^3$ mbar. Preferably pressure is between about $10^{-2}$ mbar and about 20 mbar, more preferably between about $10^{-1}$ mbar and about 10 mbar.

While the residence time for the excited species is kept relatively low, representing a relative rapid rate of flow through the reaction space, the duration of the plasma phase is desirably kept long enough to ensure saturative reaction of the excited species with the substrate surface. The plasma phase duration is the time during which the excited species is supplied to the substrate while plasma or other exciting power is coupled to the gas from which the excited species is generated. In some embodiments, the plasma phase can have a duration greater than about 0.05 s. Preferably the plasma phase has a duration greater than about 0.1 s, more preferably greater than about 0.2 s or 0.5 s. While lengthening the cycle duration may not be economical in terms of throughput, higher quality films can be more important in some situations, particularly where very thin, conformal layers are desired. However, most reactors will have practical limits on the duration of the plasma phase, such as the need to avoid overheating the substrates and/or equipment. Typically single substrate plasma ALD reactors employ plasma phase durations of less than about 10 s.

The teachings herein with respect to residence time can be applied to a number of different plasma ALD recipes, including recipes in which excited nitrogen, hydrogen or oxygen species are provided in the plasma phase(s) of the plasma ALD process. Specific examples are provided below for silicon nitride (SiN). Examples of insulating films include SiN, silicon oxide (SiO), mixtures of SiN and SiO (SiON), aluminum nitride (AlN), etc., where the above abbreviations encompass a wide variety of atomic ratios and do not necessarily represent stoichiometric materials. Other examples of insulating films include high-k films such as $ZrO_2$, $HfO_2$, $Al_2O_3$, $Ta_2O_5$, etc., as well as mixtures and non-stoichiometric forms of the above. The principles taught herein can also be applied to conductive films, such as transition metal nitrides, carbides, carbonitrides, borides and mixtures thereof, where plasma phases can supply excited nitrogen, hydrogen, carbon and/or boron species. Furthermore, excited oxygen species are also useful for conductive oxides such as $RuO_2$, $IrO_2$, $SnO_2$, etc.

FIGS. 5-8B reflect the results of experiments performed for deposition of a dielectric, particularly silicon nitride, in a reactor having the configuration of FIG. 2B, commercially available under the trade name FlexAL® from Oxford Instruments plc of Abingdon, UK. For the data presented herein, and for typical reactors, the reaction space volume V employed for the calculation of τ includes the reaction chamber from the plasma product inlet 212 to the exhaust 214. For chamber configurations with unusually high chamber volume downstream of the substrate and upstream of the exhaust outlet (e.g., greater than 30% of the total chamber volume), the calculation of τ can employ an "effective" reaction space volume that excludes the volume of the reaction chamber downstream of the substrate. Effective reaction space volumes can be as discussed above with respect to the various reaction configurations.

In the experiments, silicon nitride was deposited by a first phase including exposing the substrate to an organic silicon precursor that adsorbs on the substrate surface; followed by stopping provision of the silicon precursor to the substrate; followed by a second phase including exposing the substrate to excited nitrogen species that reacted with the adsorbed silicon species from the first phase; followed by stopping provision of the silicon precursor. It will be understood that, because the plasma ALD process is cyclical, the "first" phase need not be the first step in the process. In the experiments, stopping the provision of a reactant included both stopping the flow of the reactant to the reaction space and removal of excess reactant from the substrate surface by provision of inert purge gas through the reaction space. In the case of the plasma phase, the inert purge gas can be a continuation of $N_2$ gas after plasma power is removed from the flow, and purge gas can additionally be supplied through the inlet for the silicon precursor. In space-divided ALD embodiments, stopping the provision of a reactant can involve moving the substrate out of the silicon precursor zone, and moving the substrate through a flowing inert gas (e.g., a purge gas curtain or another zone supplied with purge gas) can additionally remove excess excited species from the substrate.

The excited nitrogen species can be provided by coupling power to a nitrogen source gas alone (especially $N_2$), a nitrogen source and hydrogen (e.g., $N_2+H_2$), or a nitrogen source and noble gas for supporting plasma generation (e.g., $NH_3+Ar$, He or Ne). Preferably nitrogen plasma includes supply of $N_2$ without noble gases.

Preferably, the silicon precursor is an aminosilane or an aminesilane. In some embodiments the silicon precursor comprises a silicon amine, where silicon is bonded to two nitrogen atoms and two hydrogen atoms. For example, the silicon precursor may comprise bis(dialkylamine)silane, $(R_2N)_2Si—H_2$. In some embodiments the silicon precursor comprises BDEAS (=bis(diethylamino)silane). In some embodiments the silicon precursor comprises a silicon amine, where silicon is bonded to three nitrogen atoms and one hydrogen atom. For example, the silicon precursor may comprise tris(dialkylamine)silane, $(R_2N)_3Si—H_3$. In some embodiments, the silicon precursor comprises a silicon amine, where silicon is bonded to four nitrogen atoms. For example, the silicon precursor may comprise tetrakis(dialkylamine)silane, $(R_2N)_4Si$. In some embodiments, the silicon precursor comprises aminosilane, where the silicon is bonded to one nitrogen atom and three hydrogen atoms. For example, the silicon precursor may comprise dialkylaminesilane, $(R_2N)Si—H_3$.

Organic compounds having a Si—Si bond and an $NH_x$ group either attached directly to silicon (to one or more silicon atoms) or to a carbon chain attached to silicon are used in some embodiments. In some embodiments, the silicon precursor may comprise an aminodisilane, such as hexakis(ethylamino)disilane. In some embodiments the silicon compound may have the formula:

wherein:
x is selected from 1 to 3;
y is selected from 1 to 3;
$R^I$ is selected from the group consisting of hydrogen, alkyl, and substituted alkyl;
$R^{II}$ is selected from the group consisting of alkyl and substituted alkyl; and
$R^{III}$ is selected from the group consisting of hydrogen, hydroxide (—OH), amino (—$NH_2$), alkoxy, alkyl, and substituted alkyl; and
each of x, y, $R^{III}$, $R^{II}$ and $R^I$ can be selected independently from each other.

In some embodiments the silicon compound is hexakis(monoalkylamino)disilane:

In other embodiments the silicon compound is $(CH_3—O)_3Si—Si(O—CH_3)_3$

In still other embodiments, the silicon precursor is a halide, such as a silicon chloride. Examples include but are not limited to octachlorotrisilane ($Si_3Cl_8$, OCTS); hexachlorodisilane ($Si_2Cl_6$, HCDS); and dichlorosilane ($SiH_2Cl_2$, DCS).

In the experiments, a silicon amine, and particularly $SiH_2(NH_tBu)_2$, also referred to as BTBAS, was employed in alternation with products of a nitrogen-containing plasma, particularly a plasma generated from $N_2$ gas. A variety of plasma ALD conditions were applied, including substrate temperatures from about 100° C. to about 500° C., chamber pressures from about 10 mTorr to about 100 mTorr, and plasma exposure times from about 2 seconds to about 20 seconds.

Figure 5:
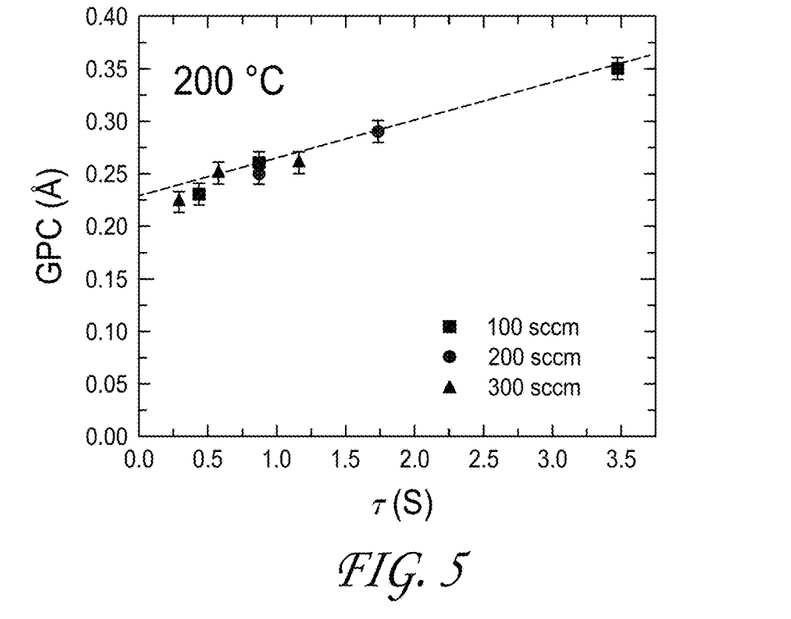
FIG. 5 is a graph illustrating deposition rates as a function of residence time for the plasma phase of a plasma ALD process.

FIG. 5 is a graph illustrating deposition rates as a function of residence time for the plasma phase of a plasma ALD process in which BTBAS was alternated with $N_2$ remote plasma to form SiN. At three different flow rates of $N_2$ at a substrate temperature of 200° C., shorter residence times for gases in the reaction space during the plasma phase led to decreased deposition rates in terms of growth per cycle, as shown.

Figure 6:
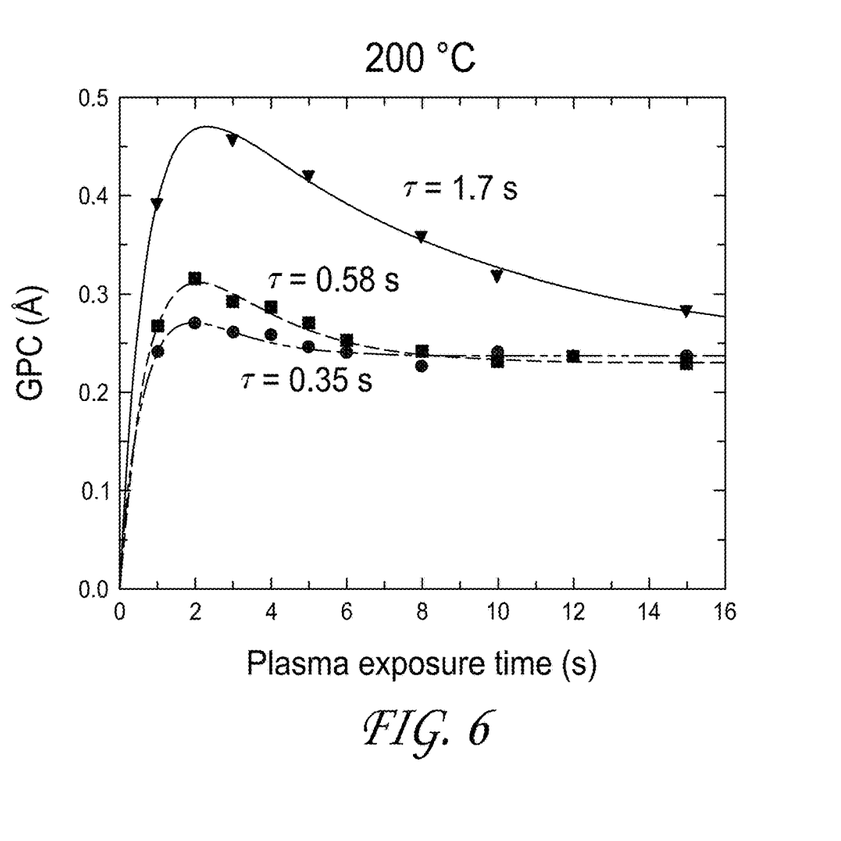
FIG. 6 is a graph illustrating deposition rates as a function of plasma phase duration at three different residence times for the plasma phase of a plasma ALD process.

FIG. 6 is a graph illustrating deposition rates as a function of plasma phase duration at three different residence times for the plasma phase of a plasma ALD process in which BTBAS was alternated with $N_2$ remote plasma to form SiN. Each of the three experiments reflected an initial rapid increase in deposition rates as the duration of the plasma phase was increased, peaking at 2-3 seconds, beyond which further prolonged plasma phases reduced the rate of deposition in terms of growth per cycle. The data reinforces the findings of FIG. 5 that reducing the residence time by increasing the speed of flow through the reaction space reduced the deposition rate.

Figure 7:
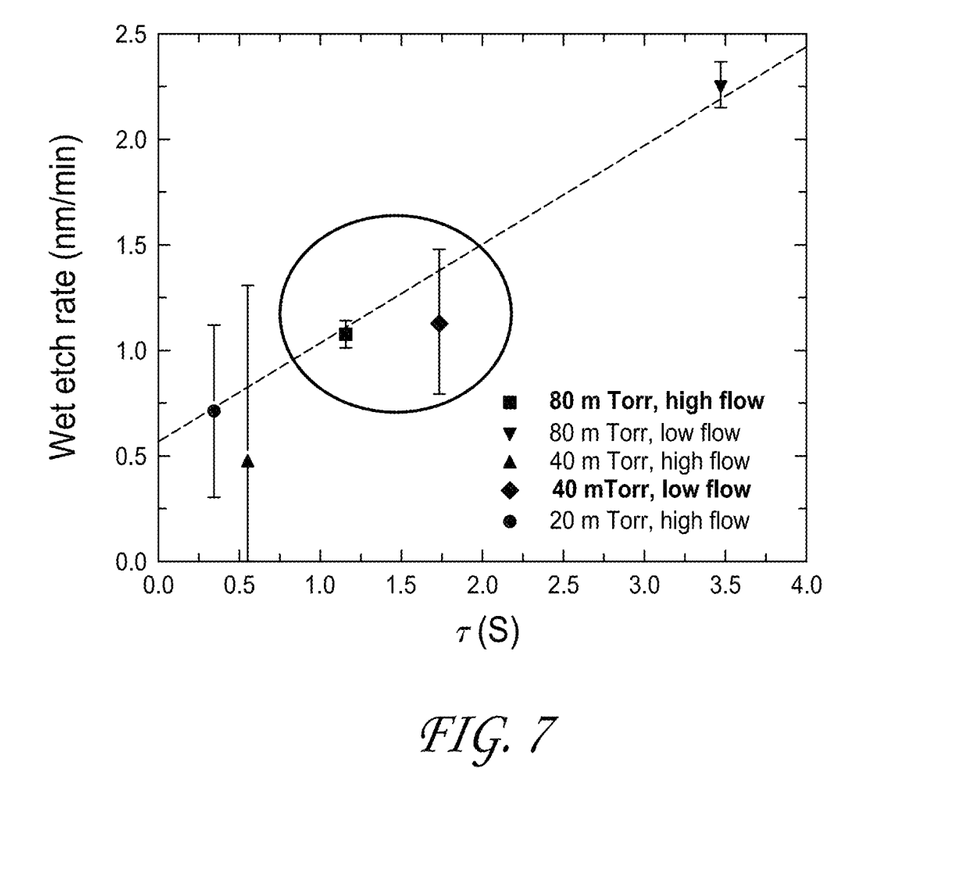
FIG. 7 is a graph illustrating wet etch rates as a function of residence time for the plasma phase of a plasma ALD process.

FIG. 7 is a graph illustrating wet etch rates as a function of residence time for the plasma phase of a plasma ALD process in which BTBAS was alternated with $N_2$ remote plasma to form SiN. Each of the films was etch in a 7:1 buffered HF solution and the rate of etch measured. Lower wet etch rates are an indication of higher quality for the SiN films. As shown, lower residence time correlates with lower wet etch rates and thus higher quality SiN films. The depositions employed substrate temperatures of 400° C. with a long (10 s) plasma phase. The residence time for the excited species was modulated by controlling the chamber pressure and the $N_2$ flow rate. Against expectations, even at high pressures (80 mTorr and high flow) very good quality SiN can be obtained.

Figure 8A:
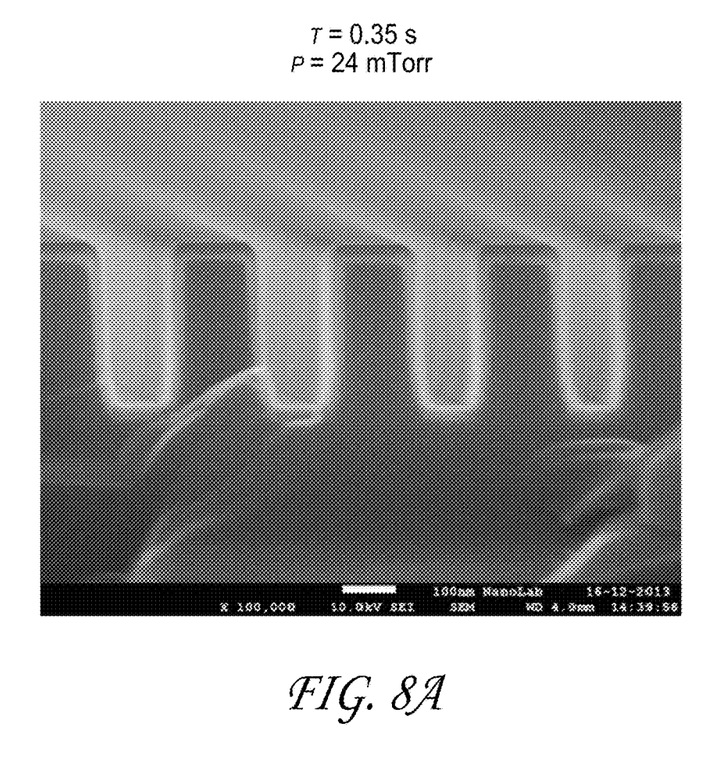
FIGS. 8A and 8B are scanning electron micrographs (SEMs) of films deposited using two different residence times for the plasma phase of a plasma ALD process.
Figure 8B:
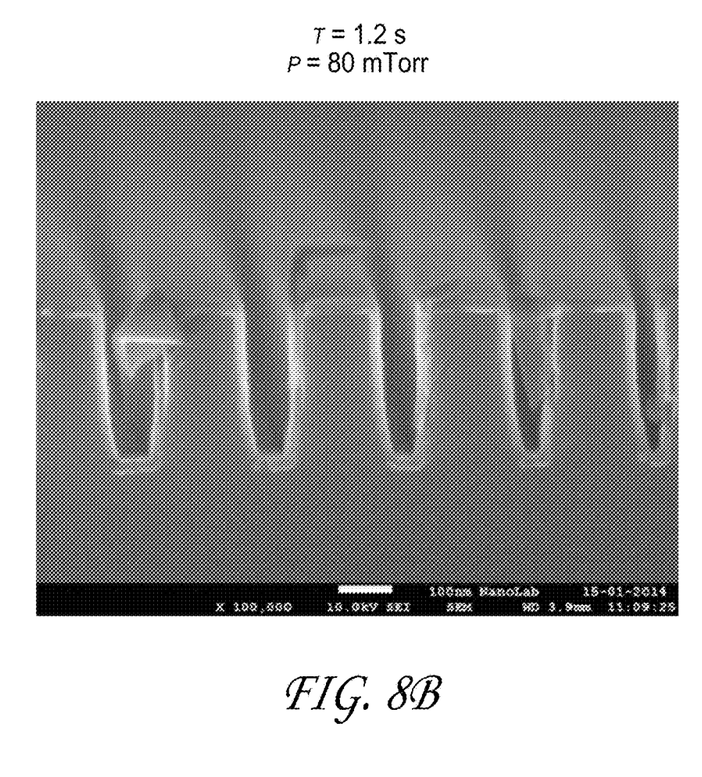

FIGS. 8A and 8B are scanning electron micrographs (SEMs) of films deposited using two different residence times for the plasma phase of a plasma ALD process in which BTBAS was alternated with $N_2$ remote plasma to form SiN. The layers were deposited under two different sets of conditions, with FIG. 8A representing a low residence time and low pressure ($\tau$=0.35 s; P=24 mTorr) and FIG. 8B representing a high residence time and high pressure ($\tau$=1.2 s; P=80 mTorr). The same two recipes were employed to deposit on features with different aspect ratios of 1.2, 2 and 4. The higher residence time employed for the process used for FIG. 8B demonstrated better conformality, likely due to a higher frequency of particle collisions under those conditions, such that the flux of the excited species was more isotropic. In particular, Table I below illustrates the sidewall/top (S/T) step coverage and the bottom/top (B/T) step coverage for both recipes on all three feature types.

TABLE I

| | $\tau$ = 0.35 s; P = 24 mTorr | | $\tau$ = 1.2 s; P = 80 mTorr | |
|---|---|---|---|---|
| Aspect ratio | S/T | B/T | S/T | B/T |
| 1.2 | 93% | 95% | 95% | 95% |
| 2 | 80% | 94% | 93% | 95% |
| 4 | 60% | 93% | 75% | 90% |

However, the shorter residence time for the gases during the plasma phase in the process used for FIG. 8A achieved a better quality SiN film compared to the longer residence time used for FIG. 8B. In particular, the shorter residence time during the plasma phase led to a significantly lower wet etch rate compared to the film deposited with the longer residence time during the excited species phase, and etching was performed uniformly for layers deposited on the smaller aspect ratio features. Moreover, conformality achieved using shorter residence times, while not as high as longer residence times provided, remain much higher than alternative, non-ALD deposition techniques and it is expected that further optimization can yield still better conformality while maintaining the high quality layers taught herein.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A method of depositing a layer of dielectric silicon nitride on a substrate in a reaction space by plasma atomic layer deposition, the method comprising:
   in a first phase, contacting the substrate with an organic silicon precursor such that a species of the silicon precursor is adsorbed on the substrate;
   in a second phase, contacting the substrate with excited nitrogen species to react with the adsorbed species, wherein the excited nitrogen species is supplied to or formed in the reaction space for greater than 0.1 s, and wherein the residence time of the excited nitrogen species in the reaction space during the second phase is less than 0.2 s; and
   cyclically repeating the first phase and second phase to form the dielectric SiN layer,
   wherein the layer of dielectric silicon nitride contains less than 2 atomic % carbon, and
   wherein the layer of dielectric silicon nitride has an etch rate of less than 1.5 nm/min in a buffered, 7:1 dilute HF solution.

2. The method of claim 1, further comprising purging the reaction space between the first phase and the second phase.

3. The method of claim 1, wherein in the second phase the excited nitrogen species replace ligands on the adsorbed species with nitrogen to leave a layer of dielectric SiN.

4. The method of claim 1, wherein the silicon precursor is a halide and the dielectric SiN layer contains less than 2 atomic % of a halogen from the silicon precursor.

5. The method of claim 1, wherein the silicon precursor comprises a silicon amine.

6. The method of claim 5, wherein the silicon precursor comprises BTBAS.

7. The method of claim 1, wherein in the second phase the excited nitrogen species are supplied from a remote plasma unit.

8. The method of claim 1, wherein the second phase comprises generating a plasma from nitrogen gas alone and supplying the excited nitrogen species from the plasma.

9. The method of claim 1, wherein the second phase comprises generating a plasma from nitrogen gas and hydrogen gas and supplying the excited nitrogen species from the plasma.

10. The method of claim 1, wherein the excited nitrogen species is supplied to or formed in the reaction space for greater than 0.5 s.

11. The method of claim 1, wherein the layer of dielectric silicon nitride has an index of refraction greater than 1.9.

12. A method of depositing a SiN film on a substrate in a reaction space, the method comprising:
   contacting the substrate with an organic silicon precursor;
   subsequently contacting the substrate with excited nitrogen species, wherein the excited nitrogen species is supplied to or formed in the reaction space for greater than 0.1 s, and wherein the residence time of the excited nitrogen species in the reaction space is less than 0.2 s; and
   repeating contacting the substrate with the silicon precursor and the excited nitrogen species to form a film consisting essentially of dielectric SiN,
   wherein the SiN film contains less than 2 atomic % carbon, and
   wherein the SiN film has an etch rate of less than 1.5 nm/min in a buffered, 7:1 dilute HF solution.

13. The method of claim 12, further comprising purging the reaction space between contacting the substrate with the silicon precursor and contacting the substrate with the excited nitrogen species.

14. The method of claim 12, wherein the excited nitrogen species is supplied to or formed in the reaction space for greater than 0.5 s.

15. The method of claim 12, wherein the excited nitrogen species are supplied from a remote plasma unit.

16. The method of claim 12, wherein the silicon precursor comprises a silicon amine.

17. The method of claim 12, wherein the SiN film has an index of refraction greater than 1.9.

* * * * *